United States Patent
Johnson et al.

(10) Patent No.: US 8,084,706 B2
(45) Date of Patent: Dec. 27, 2011

(54) SYSTEM AND METHOD FOR LASER PROCESSING AT NON-CONSTANT VELOCITIES

(75) Inventors: Shepard D. Johnson, Andover, MA (US); Bo Gu, North Andover, MA (US)

(73) Assignee: GSI Group Corporation, Bedford, MA (US)

(*) Notice: Subject to any disclaimer, the term of this patent is extended or adjusted under 35 U.S.C. 154(b) by 1426 days.

(21) Appl. No.: 11/532,160

(22) Filed: Sep. 15, 2006

(65) Prior Publication Data

US 2008/0029491 A1 Feb. 7, 2008

Related U.S. Application Data

(60) Provisional application No. 60/832,082, filed on Jul. 20, 2006.

(51) Int. Cl.
*B23K 26/00* (2006.01)
*H01L 21/331* (2006.01)

(52) U.S. Cl. .............. 219/121.6; 219/121.8; 219/121.69; 219/121.85; 438/342; 438/353

(58) Field of Classification Search ............... 219/121.8, 219/121.69, 121.68, 121.85, 121.6, 121.61; 438/342, 353
See application file for complete search history.

(56) References Cited

U.S. PATENT DOCUMENTS

| | | | |
|---|---|---|---|
| 4,114,018 A | 9/1978 | Von Allmen et al. | |
| 4,483,005 A | 11/1984 | Smart | |
| 4,532,402 A | 7/1985 | Overbeck | |
| 4,555,610 A | 11/1985 | Polad et al. | |
| 4,829,219 A | 5/1989 | Penkar | |
| 4,914,663 A | 4/1990 | Basu et al. | |
| 5,057,664 A | 10/1991 | Johnson et al. | |
| 5,059,764 A | 10/1991 | Baer | |
| 5,128,601 A | 7/1992 | Orbach et al. | |
| 5,200,677 A | 4/1993 | Dueck et al. | |
| 5,208,437 A | 5/1993 | Miyauchi et al. | |
| 5,265,114 A | 11/1993 | Sun et al. | |
| 5,268,911 A | 12/1993 | Young | |
| 5,280,491 A | 1/1994 | Lai | |
| 5,293,025 A | 3/1994 | Wang | |

(Continued)

FOREIGN PATENT DOCUMENTS

JP 0817985 1/1996

(Continued)

OTHER PUBLICATIONS

S. Hoogland et al., "Passively Mode-Locked Diode-Pumped Surface-Emitting Semiconductor Laser," IEEE Photonics Technology Letters, Vo. 12, No. 9, Sep. 2000, pp. 1135-1137.

(Continued)

*Primary Examiner* — Tu B Hoang
*Assistant Examiner* — Ket D Dang
(74) *Attorney, Agent, or Firm* — Gesmer Updegrove LLP

(57) ABSTRACT

A method is disclosed for on-the-fly processing at least one structure of a group of structures with a pulsed laser output. The method includes the steps of relatively positioning the group of structures and the pulsed laser output axis with non-constant velocity, and applying the pulsed laser output to the at least one structure of the group of structures during the step of relatively positioning the group of structures and the pulsed laser output axis with non-constant velocity.

26 Claims, 7 Drawing Sheets

U.S. PATENT DOCUMENTS

| | | |
|---|---|---|
| 5,300,756 A | 4/1994 | Cordingley |
| 5,374,590 A | 12/1994 | Batdorf et al. |
| 5,400,350 A | 3/1995 | Galvanauskas |
| 5,453,594 A | 9/1995 | Konecny |
| 5,473,624 A | 12/1995 | Sun |
| 5,520,679 A | 5/1996 | Lin |
| 5,539,764 A | 7/1996 | Shields et al. |
| 5,569,398 A | 10/1996 | Sun et al. |
| 5,609,779 A | 3/1997 | Crow et al. |
| 5,611,946 A | 3/1997 | Leong et al. |
| 5,653,900 A | 8/1997 | Clement et al. |
| 5,662,822 A | 9/1997 | Tada et al. |
| 5,685,995 A | 11/1997 | Sun et al. |
| 5,696,778 A | 12/1997 | MacPherson |
| 5,720,894 A | 2/1998 | Neev et al. |
| 5,725,914 A | 3/1998 | Opower |
| 5,742,634 A | 4/1998 | Rieger et al. |
| 5,751,585 A | 5/1998 | Cutler et al. |
| 5,759,428 A | 6/1998 | Balamane et al. |
| 5,786,560 A | 7/1998 | Tatah et al. |
| 5,790,574 A | 8/1998 | Rieger et al. |
| 5,808,887 A | 9/1998 | Dorst et al. |
| 5,812,569 A | 9/1998 | Walker et al. |
| 5,837,962 A | 11/1998 | Overbeck |
| 5,841,099 A | 11/1998 | Owen et al. |
| 5,847,960 A | 12/1998 | Cutler et al. |
| 5,867,305 A | 2/1999 | Waarts et al. |
| 5,998,759 A | 12/1999 | Smart |
| 6,025,256 A | 2/2000 | Swenson et al. |
| 6,057,180 A | 5/2000 | Sun et al. |
| 6,144,118 A | 11/2000 | Cahill et al. |
| 6,150,630 A | 11/2000 | Perry et al. |
| 6,151,338 A | 11/2000 | Grubb et al. |
| 6,156,030 A | 12/2000 | Neev |
| 6,169,014 B1 | 1/2001 | McCulloch |
| 6,172,325 B1 | 1/2001 | Baird et al. |
| 6,181,728 B1 | 1/2001 | Cordingley et al. |
| 6,191,486 B1 | 2/2001 | Bernstein |
| 6,210,401 B1 | 4/2001 | Lai |
| 6,216,058 B1 | 4/2001 | Hosek et al. |
| 6,239,406 B1 | 5/2001 | Onoma et al. |
| 6,252,195 B1 | 6/2001 | Mosavi et al. |
| 6,268,586 B1 | 7/2001 | Stuart et al. |
| 6,281,471 B1 | 8/2001 | Smart |
| 6,285,002 B1 | 9/2001 | Ngoi et al. |
| 6,300,590 B1 | 10/2001 | Lauer et al. |
| 6,324,195 B1 | 11/2001 | Suzuki et al. |
| 6,337,462 B1 | 1/2002 | Smart |
| 6,339,604 B1 | 1/2002 | Smart |
| 6,340,806 B1 | 1/2002 | Smart et al. |
| 6,341,029 B1 | 1/2002 | Fillion et al. |
| 6,346,687 B1 | 2/2002 | Kinoshita et al. |
| 6,381,259 B2 | 4/2002 | Cordingley et al. |
| 6,433,301 B1 | 8/2002 | Dunsky et al. |
| 6,472,295 B1 | 10/2002 | Morris et al. |
| 6,483,071 B1 | 11/2002 | Hunter et al. |
| 6,495,791 B2 | 12/2002 | Hunter et al. |
| 6,541,731 B2 | 4/2003 | Mead et al. |
| 6,552,301 B2 | 4/2003 | Herman et al. |
| 6,559,412 B2 | 5/2003 | Lauer et al. |
| 6,573,473 B2 | 6/2003 | Hunter et al. |
| 6,574,250 B2 | 6/2003 | Sun et al. |
| 6,580,055 B2 | 6/2003 | Iso |
| 6,621,040 B1 | 9/2003 | Perry et al. |
| 6,662,063 B2 | 12/2003 | Hunter et al. |
| 6,664,498 B2 | 12/2003 | Forsman et al. |
| 6,689,985 B2 | 2/2004 | Lipman et al. |
| 6,710,289 B2 | 3/2004 | Iso |
| 6,717,101 B2 | 4/2004 | Morris et al. |
| 6,727,458 B2 | 4/2004 | Smart |
| 6,738,396 B2 | 5/2004 | Filgas et al. |
| 6,744,228 B1 | 6/2004 | Cahill et al. |
| 6,785,304 B2 | 8/2004 | Filgas et al. |
| 6,791,059 B2 | 9/2004 | Smart |
| 6,850,812 B2 | 2/2005 | Dinauer et al. |
| 6,879,605 B2 | 4/2005 | Kyusho et al. |
| 6,901,090 B1 | 5/2005 | Ohtsuki |
| 6,947,123 B1 | 9/2005 | Ohtsuki |
| 6,947,454 B2 | 9/2005 | Sun et al. |
| 6,951,995 B2 | 10/2005 | Couch et al. |
| 6,972,268 B2 | 12/2005 | Ehrmann et al. |
| 6,989,508 B2 | 1/2006 | Ehrmann et al. |
| 7,050,208 B2 | 5/2006 | Overbeck |
| 7,065,121 B2 | 6/2006 | Filgas et al. |
| 7,126,746 B2 | 10/2006 | Sun et al. |
| 2001/0009250 A1 | 7/2001 | Herman et al. |
| 2001/0029674 A1* | 10/2001 | Cutler ............................. 33/1 M |
| 2001/0045419 A1 | 11/2001 | Dunsky et al. |
| 2001/0050931 A1 | 12/2001 | Iso |
| 2002/0003130 A1 | 1/2002 | Sun et al. |
| 2002/0005396 A1 | 1/2002 | Baird et al. |
| 2002/0009843 A1 | 1/2002 | Kyusho et al. |
| 2002/0141473 A1 | 10/2002 | Cordingley et al. |
| 2002/0162360 A1 | 11/2002 | Schaffer et al. |
| 2002/0167581 A1 | 11/2002 | Cordingley et al. |
| 2002/0170898 A1 | 11/2002 | Ehrmann et al. |
| 2003/0021324 A1 | 1/2003 | Filgas |
| 2003/0042230 A1 | 3/2003 | Gross et al. |
| 2003/0151053 A1 | 8/2003 | Sun et al. |
| 2003/0160034 A1 | 8/2003 | Filgas et al. |
| 2003/0161375 A1 | 8/2003 | Filgas et al. |
| 2003/0222324 A1 | 12/2003 | Sun et al. |
| 2003/0222330 A1 | 12/2003 | Sun et al. |
| 2004/0134896 A1 | 7/2004 | Gu et al. |
| 2004/0231682 A1 | 11/2004 | Stoltz et al. |
| 2005/0041976 A1 | 2/2005 | Sun et al. |
| 2005/0067388 A1 | 3/2005 | Sun et al. |
| 2005/0224469 A1* | 10/2005 | Cutler et al. ............ 219/121.6 |
| 2005/0254109 A1 | 11/2005 | Bruland et al. |
| 2005/0270629 A1 | 12/2005 | Johnson |
| 2005/0270630 A1 | 12/2005 | Johnson |
| 2005/0270631 A1 | 12/2005 | Johnson |
| 2005/0279739 A1* | 12/2005 | Bruland et al. .......... 219/121.69 |
| 2005/0282319 A1 | 12/2005 | Bruland et al. |
| 2006/0027540 A1 | 2/2006 | Bruland et al. |
| 2006/0119691 A1* | 6/2006 | Shigematsu et al. .......... 347/131 |
| 2006/0191884 A1 | 8/2006 | Johnson et al. |
| 2007/0053391 A1 | 3/2007 | Oron et al. |
| 2007/0133627 A1 | 6/2007 | Sun |

FOREIGN PATENT DOCUMENTS

| | | |
|---|---|---|
| JP | 08017985 A | 1/1996 |
| WO | WO9842050 | 9/1998 |

OTHER PUBLICATIONS

J.F. Ready (ed.), LIA Handbook of Laser Material Processing, Chapter 19, Laser Institute of America, 2001, pp. 595-615.

J. Lee et al., "Laser Processing of Ultra Fine Pitch Fuse Structures in 65nm Node Technology," 2004 Semiconductor Equipment and Materials International, SEMICON West 2004, SEMI Technical Symposium: Innovations in Semiconductor Manufacturing, 9 pgs.

* cited by examiner

SYSTEM AND METHOD FOR LASER PROCESSING AT NON-CONSTANT VELOCITIES

PRIORITY

The present application claims priority to U.S. Provisional Patent Application Ser. No. 60/832,082 filed Jul. 20, 2006.

BACKGROUND

The present invention relates generally to laser processing of integrated circuits on semiconductor wafers, and relates in particular to severing conductive links (e.g., link blowing) on memory integrated circuits. For example, "LIA Handbook of Laser Materials Processing," by J. F. Ready, Laser Institute of America, 2001, discloses general information regarding link blowing at Chapter 19.

When manufactured, memory die typically include some number of defective memory cells due to limitations in semiconductor fabrication technologies. To make memory die with defective memory cells useable, memory die are typically manufactured containing extra memory cells that may be used in place of defective cells. The defective memory cells must then be isolated. Integrated circuit memory repair systems employ a focused laser beam to open (or blast) fusible links on integrated circuit memory die in order to provide that only properly functioning memory cells are coupled to the circuit memory.

The processing speed of conventional memory repair systems, however, may be limited by the pulse repetition rate of the laser system. As the demands of laser processing systems increase, there is a need for memory repair systems to be faster and more efficient. Efforts to change the pulse rate however, for example by increasing the Q switch rate, result in changes in pulse shape and energy, which may adversely affect memory system repair.

There is a need, therefore, for faster and more efficient memory repair systems.

SUMMARY

The invention provides a method for on-the-fly processing at least one structure of a group of structures with a pulsed laser output. In accordance with an embodiment, the method includes the steps of relatively positioning the group of structures and the pulsed laser output axis with non-constant velocity, and applying the pulsed laser output to the at least one structure during the step of relatively positioning the group of structures and the pulsed laser output axis with non-constant velocity. In accordance with an embodiment, a mode locked laser is used at pulse rate frequencies from about 10 MHz to about 200 MHz, and in accordance with further embodiments, each link to be blasted may receive a plurality of pulses. In accordance with an embodiment of the invention therefore, it is no longer required to synchronize the substrate/stage velocity with the laser pulse rate to provide that a link to be blasted is positioned at the location of the focused laser beam at the time of a laser pulse.

BRIEF DESCRIPTION OF THE ILLUSTRATED EMBODIMENTS

The following description may be further understood with reference to the accompanying drawings in which.

The drawings are shown for illustrative purposes only.

DETAILED DESCRIPTION

The memory cells on a memory die are typically arranged in a matrix of rows and columns of memory cells. Extra memory cells are included on the memory die by increasing the number of rows and/or columns of the memory matrix to include excess rows and columns of memory cells. Defective memory cells in the memory matrix are avoided (not used) by modifying memory matrix addressing to provide matrix rows and columns that are defect free. Fusible links are used to modify memory matrix addressing, and a laser is used to open (or blast) the selected fusible links in a laser memory repair system. Memory die are processed therefore to select only defect free memory cells before the wafer is diced. Typically memory wafers are 200 mm or 300 mm in diameter.

The fusible links on memory die are typically arranged in groups of links where each group consists of a row or column of links. Within each row or column the links are generally spaced at equal increments. Link size and spacing vary significantly dependent on the manufacturer and the memory design. Link dimensions for a typical memory design may be for example, 0.4 µm wide and 4 µm long, with 3 µm space between links.

Figure 6:
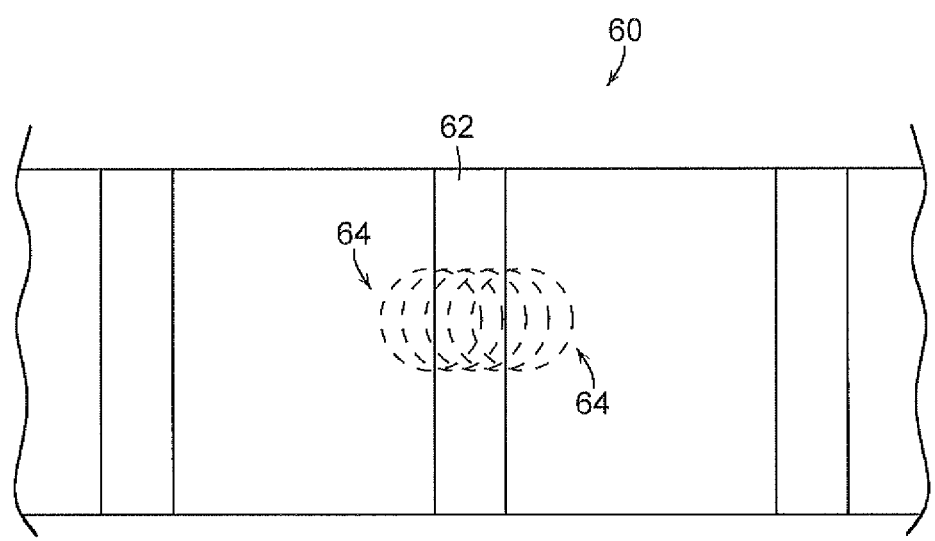
FIG. 6 shows an illustrative diagrammatic view of a plurality of heat affected zones of a link being blasted with multiple pulses in accordance with an embodiment of the invention.

Further designs may include at least some links having widths of about 0.1-0.2 µm, spaced apart at about 1-1.5 um. Link processing at the finer scale using a 50 MHz mode locked laser as disclosed, for example, in "Laser Processing of Ultra Fine Pitch Fuse Structures in 65 µm Node Technology", Society for Equipment and Materials International, SEMICON West 2004 by Joohan Lee, James Cordingley and Joseph J. Griffiths shows in FIG. 6 thereof a burst of (amplified) mode locked pulses, at least a portion which was applied to a link has also been achieved in accordance with the invention.

The memory repair system is provided a map of link locations on the memory die and a file listing the links on each die on the wafer that need to be opened (blasted). Typically relatively few links on a circuit are blasted and the locations of the links blasted on each circuit are typically different. The memory repair system opens the links using a pulsed laser beam focused to a desired beam waist.

The links to be blasted are positioned in the XY plane relative to the focused laser beam axis. For example, the wafer may be carried on a precision XY stage during processing. Other relative positioning devices and systems can be used and combined to structures for processing. These may include split stage positioning systems, multi-rate positioning systems, galvanometer scanners, acousto-optic deflectors, fast steering mirrors, electro-optic deflectors and piezo driven positioners. It is to be understood that although for convenience positioning may be referred in terms of stage motion, the scope of the invention includes other positioning schemes. Laser focus is maintained during link blasting by adjusting laser focus position (beam waist) in the Z axis (vertical axis).

Prior to link blasting, the position and orientation of the die sites carried on the wafer must be precisely registered with the laser focus position. Alignment may include camera imaging and laser scanning of alignment targets or of other target features. Typically, laser edge scanning is used for fine alignment and the scanning overhead contributes to the overall link processing time.

When blasting a group of links a laser is fired (pulsed) at approximately a constant repetition rate. Firing the laser at a constant repetition rate helps maintain a precise and constant amount of energy in each laser pulse thereby providing consistent laser energies to each link blasted. The constant rate may result from a laser trigger signal, or may be an inherent property of the laser cavity.

Conventionally, the stage is moved at a constant velocity during link blasting in order to position successive equally spaced links of a link group at the location of the focused laser beam at the time of the next laser pulse such that each laser pulse corresponds to a single link in a group of links. The constant velocity move used during link blasting is referred to as a CV (constant velocity) move. In accordance with an embodiment of the invention however, it is no longer required to synchronize the substrate/stage velocity with the laser pulse rate to provide that a link to be blasted is positioned at the location of the focused laser beam at the time of a laser pulse.

Not all links in a group are typically blasted, therefore not all fired laser pulses are used to blast links. A pulse selector (typically an acoustic optic modulator) is used to route pulses either through the focusing lens to the link if the link is to be blasted or to a beam dump if the link is not to be left blasted. An acoustic optic modulator is typically also used to reduce the laser pulse energy to the desired energy for blasting a link.

Various motion profiles, aspects of path planning, and trajectory generation are disclosed, for example in U.S. Pat. Nos. 6,144,118; 6,483,071 and 6,662,063, the disclosures of which are hereby incorporated by reference. The teachings of these references may be applied to trajectory planning in systems in accordance with various embodiments of the invention utilizing the split stage positioning systems, multi-rate positioning systems, fast steering mirrors, sold state deflectors, and piezo-electric driven positioners.

After processing a group of links the stage is then moved to the next link group to be blasted. The stage move trajectory for moves between link groups is computed to position the stage at the beginning of the next group with the appropriate velocity for blasting the next group. These non-constant velocity moves between link groups are referred to as PVT (position velocity time) moves. Conventionally, the end point requirements for the move are a position and a velocity at a specified time. The specified time is required in order to coordinate the stage X direction move with the stage Y direction move so that at the end of the move both axis meet the end point requirements at the same time.

A system controller coordinates all activities during processing. These activities include laser firing, stage/substrate motion, and pulse selection. Typically stage motions are commanded to provide move segments such that the links to be blasted are positioned at the location of the focused laser beam and then laser firing is synchronized to the stage motion. With conventional lasers, laser firing is controlled by a laser trigger signal sent from the system controller to the laser. When the laser receives a trigger signal a laser pulse is generated. The laser pulse generated occurs a small delay time after the trigger signal active edge. The delay time typically varies slightly for each pulse resulting in a small jitter in the laser firing time. The laser typically generates a pulse at the time of the trigger signal by either changing the state of a Q switch or by pulsing a seed laser.

The laser repetition rate selected is determined by the capabilities of the laser and the characteristics of the memory repair system. Typically, higher laser repetition rates result in greater system throughput. The laser is typically operated at a single repetition rate for all link groups on a wafer. Operating at a single repetition rate simplifies laser pulse energy control as pulse energy control only needs to be calibrated for the single repetition rate.

Laser pulse energy must be carefully controlled and pulse energies should be matched pulse to pulse for example, to better than 2% RMS. Firing the laser at a constant repetition helps to achieve this matching of pulse energies. This need to carefully control and match laser pulse energies, pulse to pulse, has been a primary reason for moving the stage at a constant velocity when blasting links.

In accordance with an embodiment of the invention, a very high repetition rate laser, typically in the MHz, is used such as may be provided by a mode locked solid state laser. The laser is not triggered to generate pulses at desired times; rather the laser is free running generating pulses that are not synchronized to stage/link positions. The velocity of the substrate/stage (and therefore the motion of the links) is not synchronized to the laser repetition rate. A predetermined pulse time interval is used to select a laser pulse, or plurality of pulses, from the free running laser to blast a link. This pulse time interval occurs substantially at the optimal time for positioning at the desired link. This interval starts before a pulse is selected, and ends after the last pulse is selected. No pulses are selected outside of the pulse time interval. Note that the laser is not triggered to generate a pulse at a specific time but a laser pulse, or plurality of pulses, is selected that occur at a time close to the optimal laser pulse time. Because the laser repetition rate is high as compared to the velocity of the substrate/stage, the error in link position at the time of the laser pulse is small and acceptable.

The difference in time of the actual laser pulse to the optimal time for the laser pulse is referred to as pulse time jitter. The maximum amount of pulse time jitter is approximately equal to the time between laser pulses of the free running laser. Because the substrate/stage is moving at a velocity, this pulse time jitter corresponds to position error in blasting. If the motions of the stage are acceptably small during the pulse jitter time then the resulting position errors are acceptable. For example, if the substrate/stage is moving at 150 mm/s and the laser free running repetition rate is 50 MHz, then the time between laser pulses is 1/(50 MHz)=20 ns. The substrate/stage motion during 20 ns when moving at 150 mm/s is (20 ns)*(150 mm/s)=3 nm. If a link is 0.4 μm wide then 3 nm corresponds to (3 nm/0.4 μm)*(100)=0.75% of the width of the link, which in some cases may be an acceptable motion/position error during link blasting.

Figure 1:
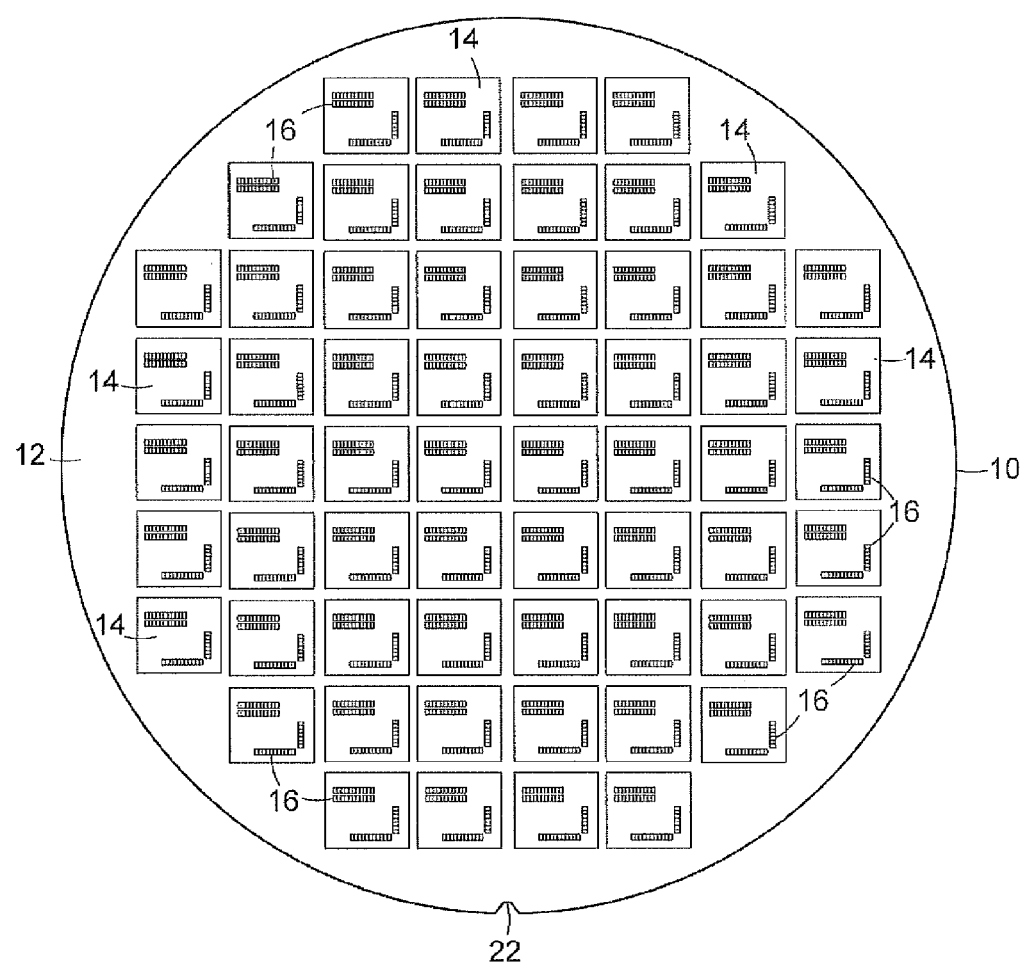
FIG. 1 shows an illustrative diagrammatic view of a wafer that may be processed in accordance with an embodiment of the invention that includes a plurality of circuits, each of which has groups of memory links.

As shown in FIG. 1, a semiconductor wafer 10 may include on a surface 12 thereof a plurality of circuits 14, each of which includes a plurality of fusible link groups 16. Each group 16 includes one or more links, and each group 16 of each circuit 14 may include one or more links 18 that have been determined to need to be blasted or opened.

During conventional link blasting, small timing corrections (phase corrections) are made in laser firing time to correct for small stage positioning errors. In accordance with the invention, substrate/stage position errors from the commanded position are compensated for by changing the start of the laser pulse time interval. Laser pulse time however, is not changed by changing the time a laser pulse is generated. Rather, laser pulse time is changed by selecting a different pulse from the free running laser within the laser pulse time interval.

Figure 2:
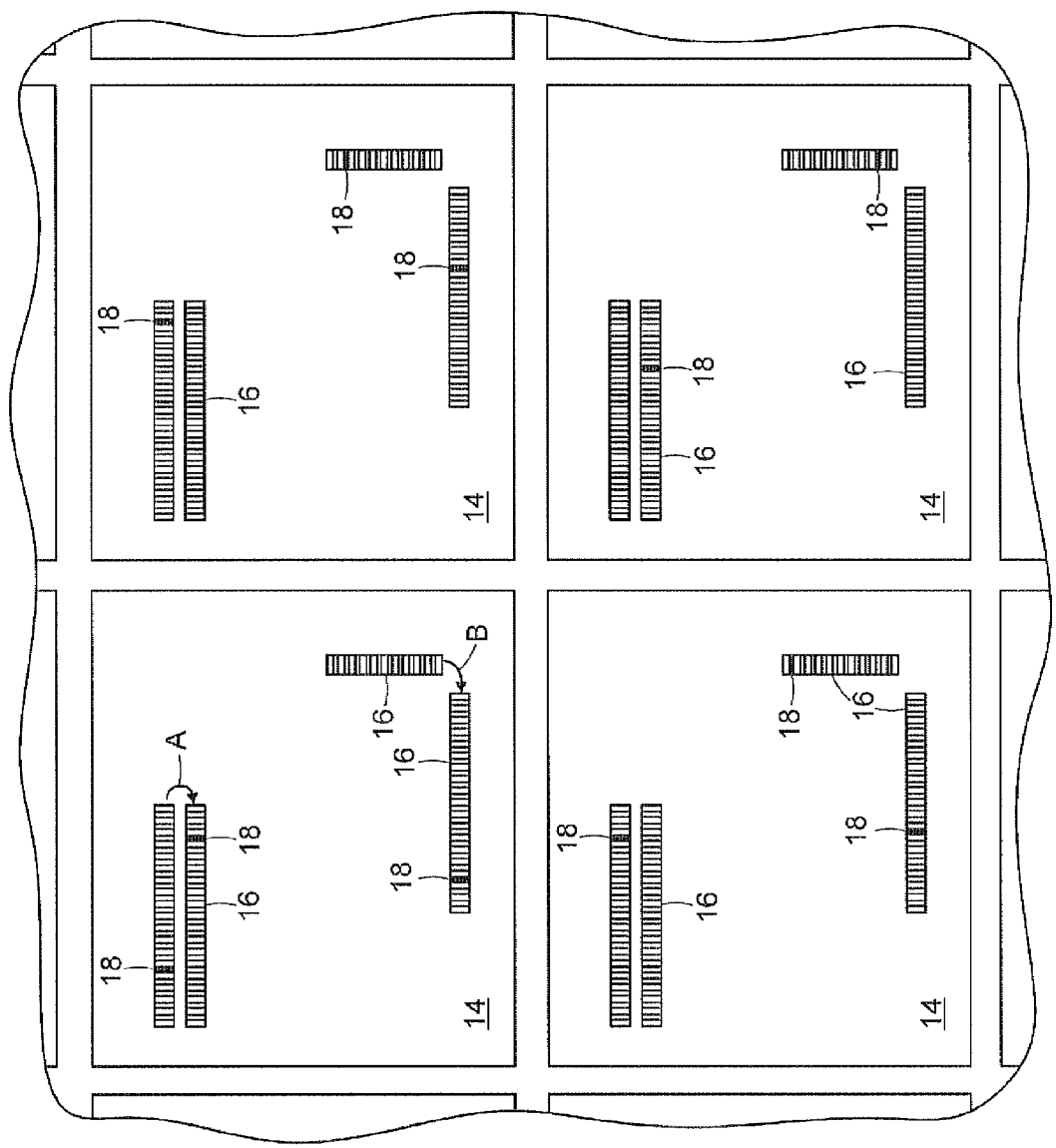
FIG. 2 shows an illustrative diagrammatic enlarged view of selected circuits of FIG. 1 showing groups of memory links having identified links that require blasting in accordance with an embodiment of the invention.

Because it is not required to use substrate/stage velocity to synchronize the laser pulse rate with the stage/substrate motion, it is not required that the substrate/stage move at a substantially constant velocity during blasting. This provides significant advantages in the movement of the stage and efficiency of the system. In accordance with various embodiments of this invention, the substrate/stage may be accelerating, decelerating, or moving at a substantially constant velocity during blasting. This allows for accelerating and decelerating during blasting of a single link group. As shown in FIG. 2 for example, the substrate or stage may be accelerating during processing of a single group, and then decelerate near the end of the group and either reverse direction along one axis (e.g., the X direction) as shown at A, or may change direction from one axis to another (e.g., from Y to X) as shown at B in FIG. 2. In either case, processing speed is increased by permitting the substrate or stage to be moved at a non-constant velocity during processing of a single group prior to the change in direction as indicated at A or B. Moreover, the ability to process at non-constant velocity also permits groups of circuits that are at the edge of the processing field (stage travel limits) to be processed more slowly at the end of the group near the edge, and then more quickly at the center and other end of the group.

Figure 3A:
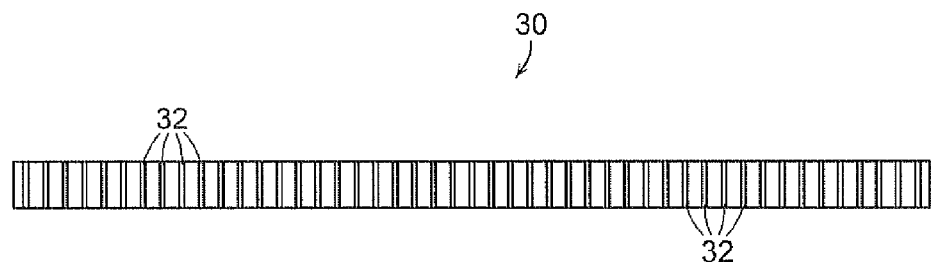
FIGS. 3A, 3B and 3C show illustrative diagrammatic views of a) a group of links, b) a linear ramped acceleration across the group of links of FIG. 3A with a central peak, and c) a linear ramped acceleration across the group of links of FIG. 3A with an extended constant acceleration peak in accordance with an embodiment of the invention.
Figure 3B:
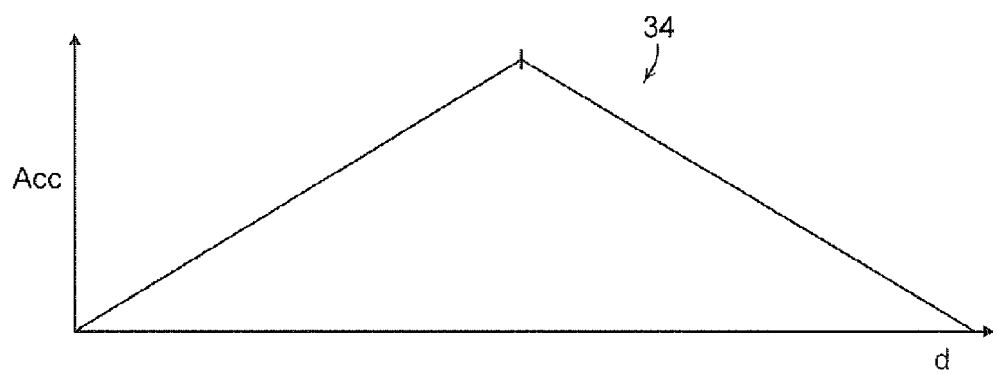
Figure 3C:
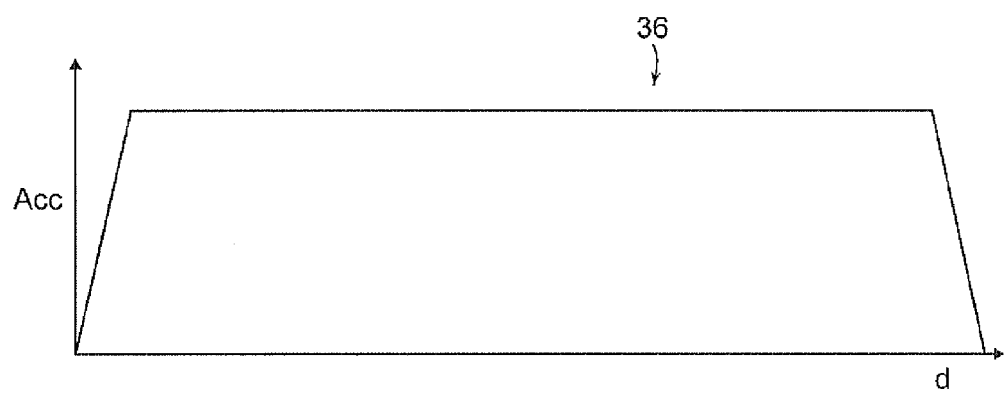

As shown for example in FIG. 3A, a group 30 of memory links 32 may be provided along a single linear direction. As shown in FIG. 3B, the acceleration of the substrate or stage may be increasing linearly until the mid-point of the travel along the group 30, and then decreasing linearly as shown at 34. As shown in FIG. 3C, the acceleration of the substrate or stage may be increasing linearly at a rapid linear rate until it reaches a plateau. The acceleration may then remain constant for an extended period time, and then decrease linearly as the substrate or stage reaches the end of the group shown at 36. More generally, the substrate or stage may be accelerating or decelerating during the blasting of a link group.

Figure 4A:
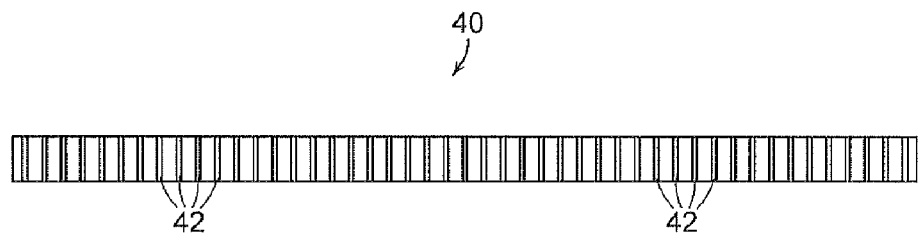
FIGS. 4A, 4B and 4C show illustrative diagrammatic views of a) a group of links, b) a non-linear ramped acceleration across the group of links of FIG. 4A with a central peak, and c) a non-linear ramped acceleration across the group of links of FIG. 4A with an extended constant acceleration peak in accordance with an embodiment of the invention.
Figure 4B:
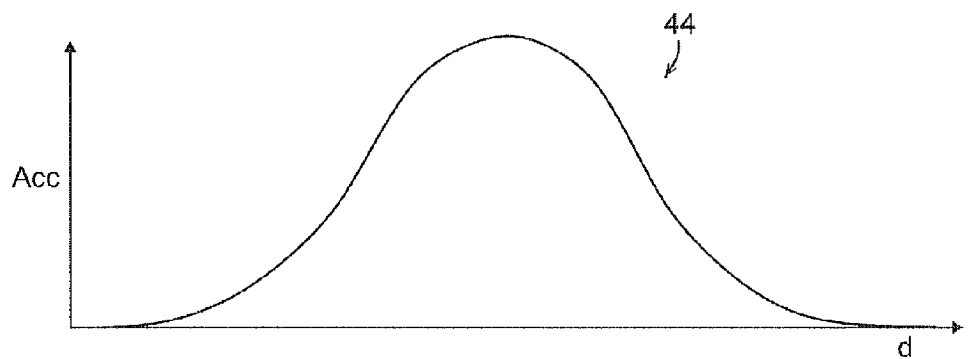
Figure 4C:
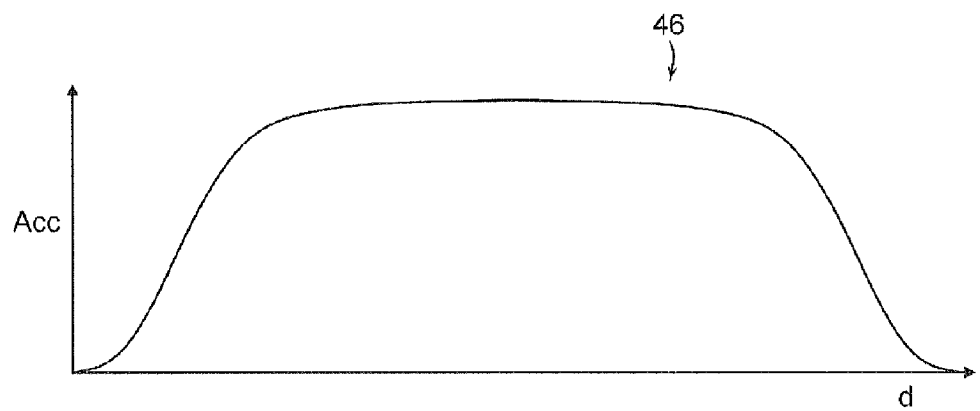

As shown in FIG. 4A, a group 40 of memory links 42 may be provided along a single linear direction, and as shown in FIG. 4B, the acceleration of the substrate or stage may be increasing non-linearly until the mid-point of the travel along the group 40, and then decreasing non-linearly as shown at 44. As shown in FIG. 4C, the acceleration of the substrate or stage may be increasing non-linearly at a rapid rate until it reaches a plateau. The acceleration may then remain relatively constant for an extended period time, and then decrease non-linearly as the substrate or stage reaches the end of the group shown at 46. Again, more generally, the substrate or stage may be accelerating or decelerating during the blasting of a link group.

Acceleration may be limited by thermal loading, power, mechanical or other system parameters. For example, high acceleration may produce high motor forces that may introduce unacceptable mechanical vibrations into the system and affect positioning accuracy. Acceleration may be reduced in combination with accelerating during blasting to improve system performance. For example, reduced acceleration may reduce mechanical vibration or other adverse conditions that generally limit usable acceleration and thereby increase system accuracy while maintaining or increasing system throughput. Reduced acceleration may be part of a structured acceleration profile and may be used in conjunction with increased periods of acceleration and with velocities that exceed conventional pulse rate limited synchronization speeds.

The laser pulse rate may be unsynchronized relative to the stage/substrate motion, and so the commanded stage velocity can be set within a continuous range of velocities. This continuous range of velocities is in contradistinction to conventional systems, where the commanded stage velocity is limited to discrete sets of velocities that are synchronized during blasting based on the laser pulse rate and the regularly spaced link pitch such that the substrate/stage is at a desired location at the time of a laser pulse. This available continuous range of velocities provides added degrees of freedom in trajectory planning that may be used to optimize system throughput.

Two directions that are generally referred to in connection with stage/substrate trajectories during link blasting are on-axis and cross-axis. The term on-axis refers to the direction along a particular group of links; and this is the direction of stage/substrate motion when blasting the particular link group. The term cross-axis refers to the direction in the XY plane orthogonal to the on-axis direction, which is the direction across the particular link group. The commanded velocity in the cross-axis direction when blasting link groups is zero.

Systems and methods of various embodiments of the present invention may permit increased system throughput during the blasting of a single link group, as well as processing of each circuit. For a single link group the velocity at the beginning of the link group may be less than the maximum blast velocity, a velocity that allows for a quick transition from a previous link group to the present link group. Then during the blasting of the link group the velocity may be increased (acceleration) to reduce the blast time and then decreased (deceleration) to bring the velocity down to a velocity that allows for a quick transition from the current link group to the next link group. Examples of such transitions are shown at A and B in FIG. 2.

Systems and methods of certain embodiments of the invention also permit increased throughput by reducing the stage/substrate travel time between link groups that are to be blasted in accordance with certain embodiments. This reduction in time is possible because of a reduction in requirements on the generated trajectory between two link groups. In conventional systems, there are requirements on the end conditions for the trajectory between two link groups and there are constraints on the actual trajectory generated for the trajectory between two link groups. In accordance with various embodiments of this invention, the number of these requirements (constraints) is reduced.

In particular, in typical conventional systems, there are nine requirements on the end conditions of a trajectory between two link groups. These requirements are the on-axis and cross-axis positions and velocities at the beginning and end of the trajectory (total of 8 requirements) and a time requirement that the end point conditions for both the on-axis and cross-axis move occur at the same time.

For the methods of certain embodiments of this invention, there are only seven requirements on the end conditions of a trajectory between two link groups. These requirements are the cross-axis positions and velocities at the beginning and end of the trajectory (total of 4 requirements), the on-axis positions at the beginning and end of the trajectory (total of 2 requirements) and a time requirement that the end point conditions for both the on-axis and cross-axis more occur at the same time. There are no longer fixed requirements on the on-axis velocities at the beginning and end of the trajectory, rather there are constraints only on the range of values for on-axis velocities at the beginning and end of the trajectory. Effectively, for the on-axis move between two blast groups, the on-axis trajectory may begin before the blasting trajectory is complete and end after blasting has begun for the next link group. There are of course also a number of constraints for the move between two groups of links. These constraints include maximum/minimum velocity, maximum/minimum acceleration, stage travel range limits, and constraints on profile shape.

In general, a throughput increase may result for moves between blast groups using the methods of this invention when the time required to position the substrate to the correct off-axis position at zero velocity is less than the time required to position the substrate to the correct on-axis position and desired on-axis blast velocity. For these cases it is often possible to modify the velocities at the end of the previous link group and/or at the beginning of the next link group such that it is possible to make the delay time between link groups equal to the time required for the off-axis move or at least less that the move time of conventional systems.

Increased throughput may also be provided in certain embodiments when blasting near the stage limits of travel. When blasting a long link group where the on-axis link group end is close to the limits of travel of the stage, it is not typically possible to blast the end of the link group at maximum on-axis velocity using conventional systems and methods. It is not possible because there is not enough distance after the end of the link group before the stage end of travel limit to reduce the stage velocity in the on-axis direction to zero. In order to blast the link group the blast velocity of the entire link group is reduced to a velocity that may be brought to zero velocity in the distance after the end of the link group before the stage end of travel limit. Alternatively, conventional systems may divide a long trajectory near the edge of stage movement of one long link group into two link groups: a long trajectory that is blasted at maximum velocity for the majority of the link group and a short trajectory near the stage travel limits that is blasted at a reduced velocity.

Using the methods of various embodiments of this invention, the entire link group does not have to be processed at a reduced velocity or broken into two link groups. The blast velocity of the link group may be reduced as the stage travel limit is approached resulting in an overall throughput improvement.

Increased throughput may also be provided in accordance with various embodiments of the invention by blasting at optimal velocity. In certain conventional systems, only a limited number of synchronized velocities may be used to blast links. The velocities available may not be optimal, for example, if the maximum stage blast velocity is 200 mm/s and the maximum blast velocity available to blast a particular link group is 150 mm/s. In this case, a sub-optimal velocity must be used for long blast groups. Using the methods of certain embodiments of this invention, the link group may be blasted at the maximum velocity resulting in increased throughput.

A link blasting system, for example, may have the following constraints on stage motion: Acceleration must be in the range $-15$ m/s$^2$ to $+15$ m/s$^2$; Blast velocity must be in the range $-0.2$ m/s to $+0.2$ m/s, with typical speeds of 50-200 mm/sec.; Acceleration pulse shapes are raised cosine shaped; and Minimum width acceleration pulse is 0.5 ms. The raised cosine acceleration pulse shape is generally shown in FIG. 4B and described by the following equation $$a(t) = \frac{1}{2} A\max\left(1 - \cos\left(2\frac{\pi t}{Tp}\right)\right)$$

The acceleration pulse end point equations for raised cosine acceleration pulses are not unique to raised cosine acceleration pulses profiles. The same acceleration pulse end point equations may result from a number of other acceleration pulse shapes. Two other acceleration pulse profile shapes that result in the same acceleration pulse end point equations are shown in FIGS. 3B and 3C.

Figure 5:
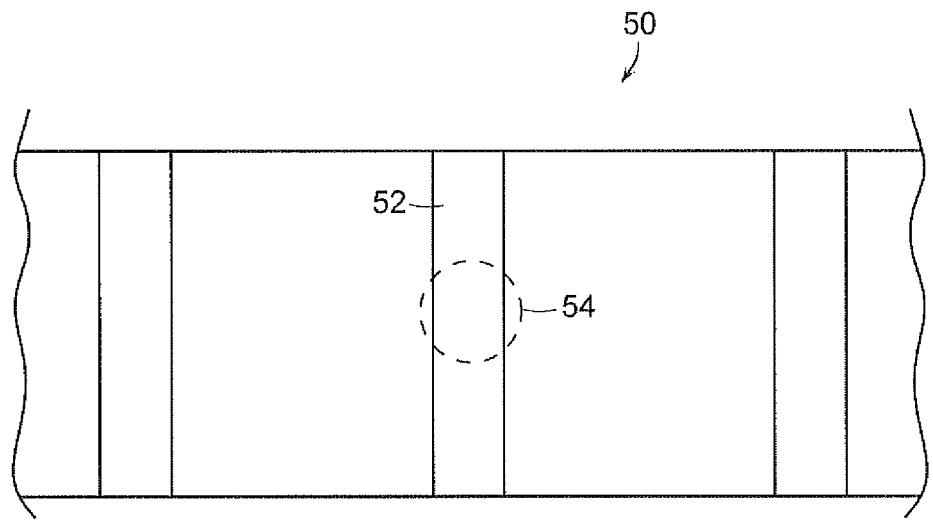
FIG. 5 shows an illustrative diagrammatic view of a heat affected zone of a link being blasted with a single pulse in accordance with an embodiment of the invention.

A laser processing system for use in accordance with an embodiment of the invention may include a mode locked laser operating above 20 MHz. The laser may generate pulses at a fixed pulse repetition rate with a fixed phase. As shown at 50 in FIG. 5, each link to be blown 52 may receive one pulse having a heat affected zone 54. Selecting pulses from a free running pulse train results in increased uncertainty in the actual time that the pulse will be delivered to the target material, which increases pulse time jitter. This increase in pulse time jitter translates into a small increase in positional error when blasting a link if the stage is moving. The corresponding increased pulse time jitter is approximately equal to the time between laser pulses of the free running laser. For example, if a substrate supporting the target material and positioning stage are moving at 150 mm/s and the free running repetition rate is 50 MHz, then the time between laser pulses is $\frac{1}{50}$ MHz=20 ns. The substrate/stage motion during 20 ns when moving at 150 mm/s is 3 nm. If a link is 0.4 μm wide, then 3 nm corresponds to 0.75% of the width of the link, an acceptable positional error during link processing. In accordance with further embodiments, and as shown at 60 in FIG. 6, each link to be blown 62 may receive a plurality of pulses providing a plurality of heat affected zones 64 across the link 62.

Figure 7:
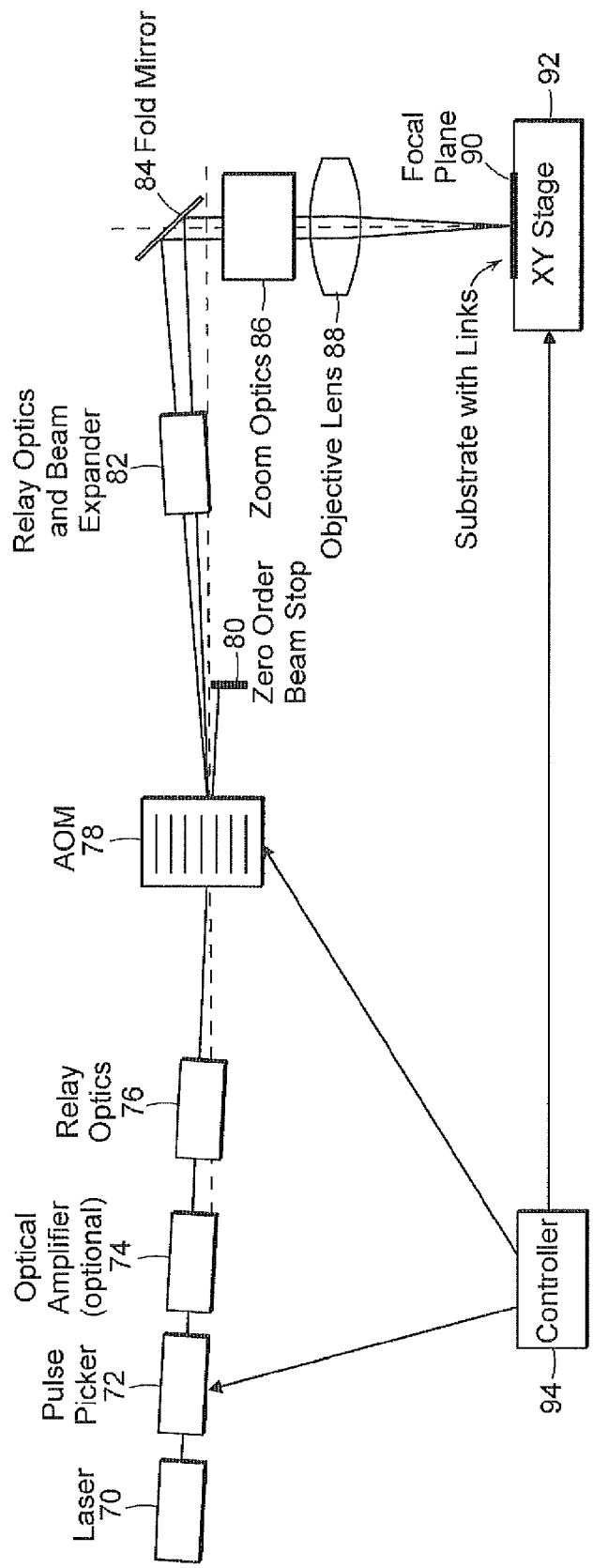
FIG. 7 shows an illustrative diagrammatic view of a laser processing system in accordance with an embodiment of the invention.

In accordance with various embodiments, the laser processing system may be as disclosed, for example, in U.S. Published Patent Application No. 2006-0191884 filed Jan. 18, 2006, the disclosure of which is hereby incorporated by reference. For example and with reference to FIG. 7, a system may include a mode locked laser system 70 (e.g., operating at 25 MHz), a pulse picker 72, an optional optical amplifier 74, relay optics 76, a pulse selection unit 78 (e.g., an acousto-optic modulator), a zero order beam stop 80, relay optics and a beam expander 82 a fold mirror 84, zoom optics 86 and an objective lens 88. The laser pulses are focused at the focal plane onto a substrate 90 having links that is supported by an XY stage 92. The position of the stage 92 is controlled by a controller 94, and the controller 94 also controls the selection of pulses by the pulse picker 72 and/or the pulse selection unit 78. The selection of pulses may be done either before or after the optical amplifier, and either or both of the pulse picker 72 and pulse selection unit 78 may be used. The system may also include an optional wavelength shifter to change the frequency of the illumination from, for example, 1064 µm to 532 µm.

The throughput advantages of systems and methods of the invention may be shown by the following examples. In a first example, a link group 30 mm in length is processed where links are 3 µm apart. As a comparison, the links are first processed at a constant velocity with a laser repetition rate of 50 kHz. The substrate/stage velocity during blasting is (3 µm)(50 kHz)=150 mm/s. The time to blast the link group is (30 mm)/(150 mm/s)=200 ms. In accordance with an embodiment of the invention, however, it is possible to begin blasting the link group at a velocity of 150 mm/s, to accelerate up to 200 mm/s during the blasting, and then to decelerate back down to 150 mm/s such that the end velocity is 150 mm/s. This trajectory requires a total time of 151.66 ms resulting in a time savings of 48.333 ms or about 24.2%.

In another example, two parallel link groups 9 mm in length are separated by 0.1875 mm in the cross-axis and where the on-axis start and end coordinates are the same. The links are blasted in opposite on-axis directions at 150 mm/s and at −150 mm/s; one link group is being blasted and then the substrate/stage is reversing direction, moving 0.1875 mm in the cross-axis and blasting the second link group. For a constant velocity trajectory, the total time is calculated is 3 parts, the time to blast the first link group, the time to reverse on-axis direction and step 0.1875 mm in the cross-axis, and the time to blast the second link group. The time to blast each link group is (9 mm)/(150 mm/s)=60 ms. The time to reverse on-axis direction is 40 ms, the time to step in the cross-axis by 0.1875 mm is 10 ms. Since the time to reverse on-axis direction is greater than the time to step in the cross-axis this is effectively the time required for the turn around. Therefore the total time to process the two link groups is about (60 ms)+(40 ms)+(60 ms)=160 ms. Using the methods of certain embodiments of this invention it is possible to begin the turn around in the on-axis direction before the blasting is complete. In this example, the deceleration is begun 15 ms before the end of the link group blasting. Then the total time to process the two link groups is (60 ms−15 ms)+(40 ms)+(60 ms−15 ms)=130 ms resulting in a time savings of 30 ms or about 19%. This trajectory also requires less total stage travel, therefore, this example also shows how total stage travel can be reduced near the stage travel limits.

In a third example, the laser system in a memory repair system is used to measure the location of a substrate on a stage. This operation is referred to as alignment. During an alignment operation the substrate is moved at a low constant velocity such that a feature on the substrate crosses the focused laser beam spot. I accordance with an embodiment, the laser is fired at a constant repetition rate, the pulses are optically attenuated by the AOM, and directed to the substrate along the laser processing output axis. The pulses are attenuated such that the feature on the substrate is not damaged by the laser pulse. During alignment reflected light from the feature is collected by a detector and a signal is generated. From this collected light signal it is possible to determine the location of the feature on the substrate. A similar method is used to determine best focus location. During these operations the velocity of the stage is typically about 10 mm/s. The length of a scan is typically about 50 µm. Often a number of these scans are done serially crossing the same feature on the substrate numerous times in both directions with the stage stopping between operations. The time for one of these scan operations using constant velocity methods is the time to accelerate from stopped to 10 mm/s, the time for the actual scan, and the time to decelerate to stopped. Typically the acceleration and deceleration times are equal to the minimum acceleration pulse time, assumed here to be 5 ms each. The time to scan is equal to (50 µm)/(10 mm/s)=5 ms. The total scan time, therefore, is 15 ms. Using the methods of certain embodiments of the invention, the constant velocity segment is not required. The stage could be accelerated up to 10 mm/s in 5 ms time (the minimum acceleration pulse time) and then decelerated back to stopped in another 5 ms time (the minimum acceleration pulse time). The acceleration could be set such that the total move distance is 50 µm, the scan distance. For this example an acceleration of 4 m/s$^2$ is required. The resulting total scan time is 10 ms resulting in a time savings of 5 ms or about 33%.

In accordance with another embodiment, the alignment operation may be a carried out during acceleration, with a low power laser, high speed detector, and data converter. The low power laser output axis may be aligned to the laser processing axis.

Typically the substrate is located on the XY stage with some finite rotation of the link group axis relative to the ideal stage X and Y axes. When blasting link groups therefore, there is typically a non-zero stage velocity in both the X & Y stage axis. During link blasting in conventional constant velocity systems, the stage motion in both stage axis, X and Y, are constant velocity. Because of the small rotation of the stage ideal axis relative to the substrate on-axis and cross-axis directions the stage velocity in the stage ideal coordinate system in one axis will be nearly equal to the on-axis velocity and the stage velocity in the stage ideal coordinate system in the other axis will be close to but not equal to zero. Therefore, when planning stage trajectories using the methods of this invention, it is necessary to consider this small angle between the stage ideal coordinate system and the substrate on-axis/cross-axis coordinate system. If stage trajectories are planned in the substrate on-axis/cross-axis coordinate system then the trajectory can be planned such that the cross-axis velocity is zero at the beginning of a link group to be blasted. If stage trajectories are planned in the stage ideal coordinate system then more care may be required in trajectory planning. If stage trajectories are planned in the stage ideal coordinate system and the stage axis close to the cross-axis is planned to have a constant velocity motion at the beginning of the link group to be blasted then, if the stage is moving at a non-constant velocity (accelerating or decelerating) in the stage axis close to the on-axis direction a small cross-axis error in blast position may occur. There are a number of methods to handle this possible cross-axis error. Some of the methods include: 1) Plan the trajectories in the substrate on-axis/cross-axis coordinate system. 2) Plan the trajectories in the stage ideal coordinate system and accept a small cross-axis error. Larger cross-axis errors are acceptable in link blasting because links are typically long in the cross-axis direction. 3) Put a small rotation into the XY stage to make the XY stage ideal coordinate system be the same as the substrate on-axis/cross-axis coordinate system. 4) Plan a non-constant velocity during blasting in the stage ideal coordinate axis that is close to the substrate cross-axis direction.

In accordance with further embodiments, the present invention does not require that each of the links to be blasted in a group be blasted along a single on-axis line across the group of links. In other words, some off-axis movement across a group of links may be permitted in certain embodiments.

In accordance with further embodiments, a system of the present invention does not required that the links be evenly spaced. In further embodiments, the system may provide increased maximum positioning velocity. In further embodiments, the system may provide increased laser output pulse rates and burst rates. In further embodiments, the system may reduce acceleration forces to reduce attendant mechanical perturbations thereby improving system accuracy. In further embodiments, the system may be adapted for use with multi-path and multi-spot beam positioning systems.

Pulsed lasers utilized in various embodiments may include mode locked lasers, high speed laser diodes, or various combinations thereof. For example, a GHz repetition rate/rate mode locked semiconductor lasers is disclosed in "Passively Mode-Locked Diode-Pumped Surface-Emitting Semiconductor Laser, IEEE Photonics Technology Letters, vol. 12, No. 9, September 2000 by S. Hoogland et al., and includes a semiconductor saturable absorber mirror (SESAM) in an output cavity coupled to a semiconductor laser diode. In accordance with other embodiments, mode locked lasers of Coherent, Inc. of Santa Clara, Calif., or of Lumera Laser GmbH of Germany may also be used. In accordance with further embodiments, mode locked laser as disclosed, for example, in U.S. Pat. Nos. 4,914,663 and 6,210,401 may also be used.

As previously noted, link pitch and dimensions may continue to shrink, approaching 1 um pitch with 0.1-0.4 um link widths. Link processing systems will produce decreasing spot size to match the trend. For instance, as reported in "Laser Processing of Ultra Fine Pitch Fuse Structures in 65 μm Node Technology", Society for Equipment and Materials International, SEMICON West 2004 by Joohan Lee, James Cordingley and Joseph J. Griffiths discloses a green laser that produced a spot size as fine as about 0.7 μm to process fine pitch links. The decreasing spot dimensions provide for a potential decrease in the energy of a pulse. For example, if the spot diameter is decreased from about 1.5 μm to about 1.0 μm, the total energy in a pulse may be decreased two-fold to achieve a given energy density at the target structure. Further, in some embodiments it may be advantageous to increase the number of pulses applied to a link, and to proportionately decrease the pulse energy, for example. In such embodiments the output of the pulsed laser may be sufficient to process links with minimal gain in the optional amplifier 74, or to possibly operate without the amplifier 74. In some embodiments an amplifier may be advantageous, or required. For instance, such a situation may arise if a few pulses are to process the target material.

An optional optical amplifier may be used to amplify the output of the pulsed laser. For example, a mode locked oscillator, high speed diode, or fiber laser oscillator may produce picosecond or femtosecond pulses with about 100 picojoules to a few nanojoules of energy per pulse. The amplifier will generally be used to increase the pulse energy to levels suitable for the material processing task, for instance with gain of 6 dB-50 dB. The amplifier may be a fiber laser amplifier, waveguide amplifier, or a diode pumped solid state amplifier. The amplifier may be CW or pulse pumped.

The amplifier performance will generally be limited based on a compromise of several parameters: gain, output repetition rate, and number of pulses (duty cycle) as a result of at least the achievable average power limitations.

In certain embodiments at least one of the shape and energy distribution of a group of output pulses may be altered if the amplifier is pulse pumped or otherwise operated at varied repetition rates. For example, if a pulse picker is used prior to the amplifier the inputs to the amplifier will be spaced at non-uniform temporal intervals, corresponding to a group of pulses are selected for processing. The effective repetition rate will vary, and the resulting effects will be noticeable if the amplifier is operated within a frequency range wherein the output pulse energy varies with the rate.

In some embodiments a high speed modulator, for instance the output modulator 78, may be used to control the pulse shape and energy distribution based on pre-determined spacings. For example, U.S. Pat. No. 5,128,601, the entire disclosure of which incorporated by reference herein, teaches the use of a modulator to provide for constant output pulse energy characteristics, as well as other methods for pulse control. Other systems, such as disclosed for example in U.S. Pat. Nos. 5,812,569 and 5,226,051 involve output stabilization, and the principles have been employed for use in q-switched laser systems.

In some preferred embodiments of the present invention the pulsed laser is to be operated at a constant rate with pulses selected with the output modulator 78. In such cases amplification is preferably achieved with the use of a multistage amplifier design, wherein each stage is operated so as to amplify the input pulse train while avoiding distortion, and also with gain low enough such that the amplifier operates well within the average power specification. This embodiment is particularly suited for operating at short wavelengths, for instance, green or UV wavelengths, wherein a non-linear crystal performs wavelength shifting. One stage of amplification may include a pre-amplifier. Cascaded amplifiers 74 may be fiber amplifiers. PCT Publication WO98042050, entitled "Pulsed Semiconductor High Power Amplifier and Exemplary Applications", describes many aspects of high power fiber amplifier systems, including multistage amplifiers, and exemplary applications in laser material processing.

Figure 8A:
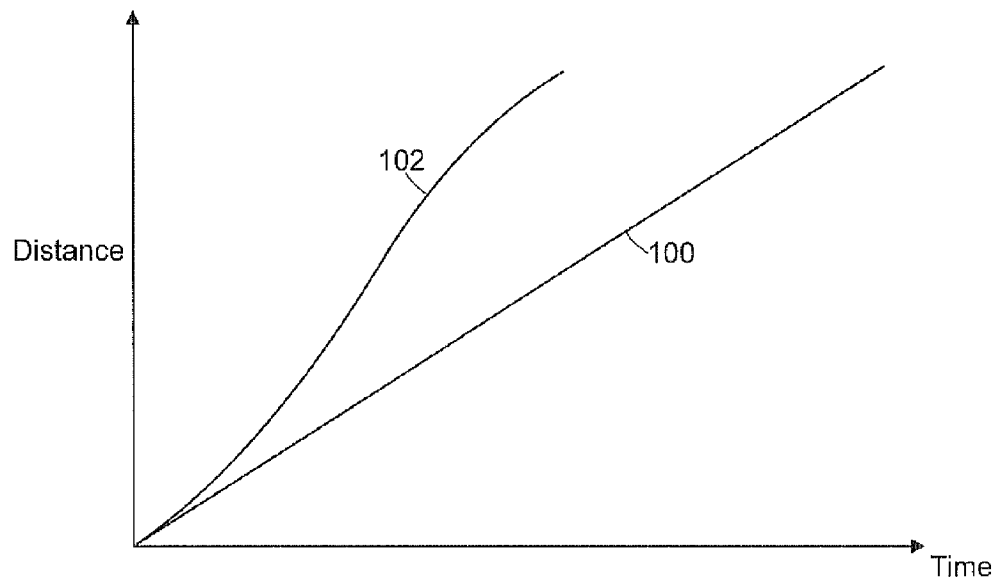
FIGS. 8A-8C show illustrative graphical and diagrammatic views of link blasting time charts in a constant velocity system and a non-constant velocity system in accordance with an embodiment of the present invention.
Figure 8B:
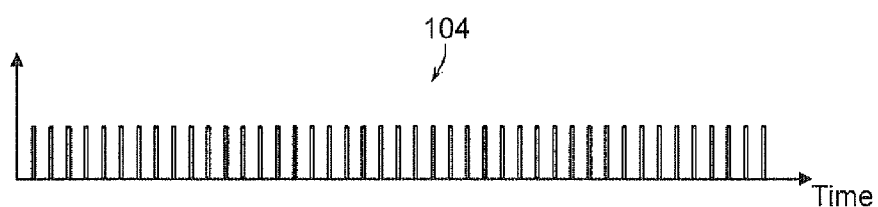
Figure 8C:
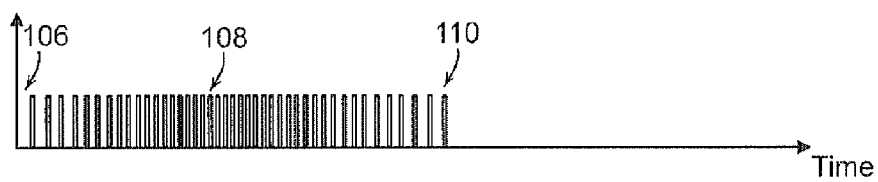

FIGS. 8A-8C compare blasting links using conventional methods and using the methods of this invention. FIG. 8A shows the distance verses time curves when blasting the same link group using conventional methods 100 and using the methods of an embodiment of the present invention 102. When blasting using conventional methods the velocity is the same (constant) for the entire link group resulting in a linear constant slope distance verses time curve 100. When blasting using the methods of this invention the velocity is not constant during the blasting time. In the example shown in FIG. 8A, at the beginning and end of curve 102 the blasting velocity is equal to the blasting velocity of curve 100, in the center of curve 102, however, the blasting velocity has increased resulting is a steeper slope to the distance verses time curve and resulting in an overall decrease in the total blast time.

In this example the links to be blasted have a constant pitch; the links are equally spaced in distance. When using conventional methods blasting at a constant velocity the blasts for the equally spaced links result in blasts that are equally spaced in time as is shown at 104 in FIG. 8B, represent the times for each blast. When using the methods of this invention blasting at changing velocity the blasts for the equally spaced links (constant pitch) result in blasts that are unequally spaced in time as is shown in FIG. 8C. In particular, the lines shown at 106 represent the times for each blast at the beginning, the lines shown at 108 represent the times for each blast in the middle, and the lines shown at 110 represent the times for each blast at the end of a link group. For this example the blasts at the beginning of the trajectory 106 and the blasts at the end of the blast trajectory 110 are spaced in time at the same spacing as the blasts using conventional methods because the velocity is the same at these times. The blasts at the center of the trajectory 108 are more closely spaced in time but are equally spaced in distance with respect to the blasts when using conventional methods because the velocity at this time is greater. Since the same number of blasts are required when using conventional methods as when using the methods of this invention the same number of blasts are shown in FIGS. 8B and 8C.

Those skilled in the art will appreciate that numerous modifications and variations may be made to the above disclosed embodiments without departing from the spirit and scope of the invention.

What is claimed is:

1. A method of on-the-fly laser processing at least one structure of a group of structures on a moving stage with a pulsed laser output along a pulsed laser output axis, the at least one structure having at least one respective optimal processing time, said method comprising the steps of:

relatively positioning the at least one structure of the group of structures and the pulsed laser output axis with non-constant velocity and applying the pulsed laser output to the at least one structure of the group of structures during the step of relatively positioning the at least one structure of the group of structures and the pulsed laser output axis with non-constant velocity by selecting one or more laser pulses from a laser that is pulsed at a constant repetition rate that is not synchronized with relatively positioning the at least one structure of the group of structures and the pulsed laser output axis such that laser processing of said at least one structure is performed during at least one time interval that comprises the at least one respective optimal processing time and a pulse-to-pulse time between sequential constant repetition rate laser pulses, wherein a distance that is characterized by a product of the at least one time interval and a relative positioning velocity at the optical processing time is within an acceptable position error between the pulsed laser output axis and the at least one structure of the group of structures.

2. The method as claimed in claim 1, wherein the pulsed laser output is provided by selecting pulses of a mode locked laser during time intervals, each time interval corresponding to a position of said at least one structure of the group of structures.

3. The method as claimed in claim 1, wherein the non-constant velocity is provided by accelerating or decelerating.

4. The method as claimed in claim 1, wherein the non-constant velocity is provided by decelerating along a current direction of movement (X) prior to relatively positioning the group of structures in a direction (Y) transverse to the current direction of movement (X).

5. The method as claimed in claim 1, wherein the non-constant velocity includes decelerating along a current direction of movement (X) prior to relatively positioning the group of structures in a direction (−X) that is a reverse direction of the current direction of movement (X).

6. The method as claimed in claim 1, wherein the group of structures includes at least a portion of a row or column of links of a semiconductor device.

7. The method as claimed in claim 6, wherein a plurality of pulses are selected to process a single link.

8. The method as claimed in claim 1, wherein a plurality of groups of structures of a semiconductor device are provided in a plurality of groups of links, each group of links including at least a portion of a row or column of links, and the method includes relatively positioning along each said row or column of links and accelerating or decelerating along at least said one row or column of links.

9. The method as claimed in claim 8, wherein the method involves accelerating away from an end of one of the plurality of groups of links or decelerating toward another end of the one of the plurality of groups of links.

10. The method as claimed in claim 1, wherein the constant rate is sufficiently rapid to allow the one or more selected laser pulses to impinge each structure in the group of structures.

11. The method as claimed in claim 1, wherein the one or more selected laser pulses are selected at a time close to the optimal processing time for positioning pulsed laser output at the at least one structure.

12. The method as claimed in claim 1, wherein the laser output impinges the structure with less than a predetermined position error.

13. The method as claimed in claim 1, wherein a difference between each selected pulse time and an optimal pulse time is less than a predetermined timing threshold.

14. The method as claimed in claim 1, wherein the constant rate is an inherent property of the laser.

15. The method as claimed in claim 1, wherein the constant rate results from a laser trigger signal that is unsynchronized relative to the positioning of the group of structures.

16. A method of laser processing a semiconductor device on a moving stage with a pulsed laser output from a mode-locked laser along a pulsed laser output axis, said method comprising the steps of:

providing the semiconductor device;

relatively positioning the semiconductor device and the pulsed laser output axis with a non-zero acceleration, and applying the pulsed laser output to structures of the semiconductor device while relatively positioning the semiconductor device and the pulsed laser output by selecting one or more laser pulses from the mode-locked laser that is pulsed at a constant rate such that laser processing of at least one structure of the semiconductor device is performed during a time interval at least as large as a pulse-to-pulse time between sequential laser pulses, wherein a distance that is characterized by a product of the time interval and a relative positioning velocity of the at least one structure at an optimal processing time is within an acceptable position error.

17. The method as claimed in claim 16, wherein the structures of the semiconductor device are conductive links, and wherein the pulsed laser output is comprised of pulses from the mode locked laser that are selected at time intervals to coincide with the conductive links on the semiconductor device.

18. The method as claimed in claim 17, wherein a group of the structures of the semiconductor device includes at least a portion of a row or column of conductive links of the semiconductor device.

19. The method as claimed in claim 17, wherein a plurality of pulses are provided to a single conductive link of the semiconductor device to process the single conductive link.

20. The method as claimed in claim 16, wherein the non-zero acceleration is provided by decelerating along a current direction of movement (X) prior to relatively positioning a group of the structures of the semiconductor device in a direction (Y) transverse to the current direction of movement (X).

21. The method as claimed in claim 16, wherein the non-zero acceleration is provided by decelerating along a current direction of movement (X) prior to relatively positioning a group of the structures of the semiconductor device in a direction (−X) that is a reverse direction of the current direction of movement (X).

22. The method as claimed in claim 16, wherein the structures of the semiconductor device are provided in groups of structures, and wherein said groups of structures include a plurality of groups of links, each group of links including at least a portion of a row or column of links, and the method includes relatively positioning along each said row or column of links and accelerating or decelerating along at least one said row or column of links.

23. The method as claimed in claim 22, wherein the method involves accelerating away from an end of one of the plurality of the groups of links or decelerating toward another end of the one of the plurality of the groups of links.

24. A method of laser processing multiple groups of structures on a moving stage with a pulsed laser output, said method comprising the steps of:
positioning a first group of structures of the multiple groups of structures relative to the pulsed laser output;
laser processing the first group of structures with the pulsed laser output during the step of positioning the first group of structures by selecting one or more laser pulses from a laser that is pulsed at a constant rate such that said laser processing of a first structure in the first group of structures may be performed during a first time interval that is at least as large as a first pulse-to-pulse time between sequential laser pulses, wherein a first distance that is characterized by a first product of the first time interval and a first relative positioning velocity of the first structure of the first group of structures at an optimal processing time is within an acceptable position error;
decelerating the first group of structures relative to the pulsed laser output during the step of laser processing the first group of structures;
positioning a second group of structures of the multiple groups of structures relative to the pulsed laser output;
laser processing the second group of structures with the pulsed laser output during the step of positioning the second group of structures by selecting one or more laser pulses from the laser that is pulsed at the constant rate such that said laser processing of a second structure in the second group of structures may be performed during a second time interval that is at least as large as a second pulse-to-pulse time between sequential laser pulses, wherein a second distance that is characterized by a second product of the second time interval and a second relative positioning velocity of the second structure of the second group of structures at the optimal processing time is within the acceptable position error; and
accelerating the second group of structures relative to the pulsed laser output during the step of laser processing the second group of structures.

25. The method as claimed in claim 24, wherein the multiple groups of structures includes conductive links, and wherein said method further includes the step of computing a processing trajectory for the laser processing the conductive links during acceleration and deceleration.

26. A method of on-the-fly laser processing at least one structure of a group of structures on a moving stage using a pulsed laser, the group of structures and at least one alignment target being supported on a semiconductor substrate, said method comprising the steps of:
generating a first laser output along a first axis;
relatively moving the substrate and the first axis with respect to each other;
directing at least a portion of the first laser output to impinge the at least one alignment target material and also at least one non-target material about the at least one alignment target and in proximity to the at least one target, the step of directing being carried out during the relative motion of the substrate and the first axis;
detecting radiation reflected from the at least one alignment target and the at least one non-target material to produce information representative of a location of the at least one alignment target;
determining at least one alignment target location based on the information;
using the alignment target location information to develop a trajectory plan;
relatively moving the at least one structure of the group of structures and the first axis based the trajectory plan;
generating a laser processing output from the first laser output having at least one pulse by selecting one or more laser pulses from the first laser that is pulsed at a constant repetition rate that is not synchronized with the relative motion of the at least one structure and the first axis such that the laser processing of the at least one structure may be performed without laser triggering being based on a relative position or a relative velocity of the at least one structure and the first axis; and
directing the one or more pulses of the laser processing output to impinge the target structure and to process the target structure during relative motion of the target structure and the first axis, wherein the relative motion includes an acceleration during at least one of the steps of directing at least a portion of the first laser output and directing the one or more pulses of the laser processing output.

* * * * *